(12) United States Patent
Lee

(10) Patent No.: US 7,361,981 B2
(45) Date of Patent: Apr. 22, 2008

(54) PAD LAYOUT

(75) Inventor: Sheng-Yuan Lee, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 112 days.

(21) Appl. No.: 11/458,787

(22) Filed: Jul. 20, 2006

(65) Prior Publication Data

US 2007/0158836 A1    Jul. 12, 2007

(30) Foreign Application Priority Data

Jan. 2, 2006    (TW) .............................. 95100057 A

(51) Int. Cl.
*H01L 23/02* (2006.01)

(52) U.S. Cl. ...................... 257/678; 257/786
(58) Field of Classification Search ................ 257/678, 257/786

See application file for complete search history.

(56) References Cited

U.S. PATENT DOCUMENTS 5,475,255 A * 12/1995 Joardar et al. .............. 257/547
6,130,485 A * 10/2000 Hirai ........................... 257/786
6,870,273 B2 * 3/2005 Tao et al. ................... 257/778

* cited by examiner

*Primary Examiner*—Roy Potter
(74) *Attorney, Agent, or Firm*—J.C. Patents

(57) ABSTRACT

A pad layout suitable for being applied on a metal interconnection structure of an integrated circuit chip is provided. The pad layout includes a first signal pad, a second signal pad, a first non-signal pad, a second non-signal pad, a first trace, a second trace, a first guard ring and a second guard ring. The second signal pad is located adjacent to the first signal pad. The first non-signal pad is located adjacent to the first signal pad. The second signal pad is located adjacent to the second signal pad. The first guard ring surrounds the first signal pad and is connected to the first non-signal pad through the first trace. The second guard ring surrounds the second signal pad and is connected to the second non-signal pad through the first trace.

20 Claims, 5 Drawing Sheets

PAD LAYOUT

CROSS-REFERENCE TO RELATED APPLICATION

This application claims the priority benefit of Taiwan application serial no. 95100057, filed on Jan. 2, 2006. All disclosure of the Taiwan application is incorporated herein by reference.

BACKGROUND OF THE INVENTION

1. Field of the Invention

The present invention relates to a pad layout on an integrated circuit chip (IC chip). More specifically, the present invention relates to a pad layout that can reduce the noise interference in an integrated circuit.

2. Description of Related Art

As the performance of an IC chip constantly increase, the working frequency of electronic signals transmitting in an IC chip increases gradually as well. However, when the working frequency of the electronic signals is increased to a high frequency level, for example over giga-hertz, the electronic signals in the IC chip are easily subjected to severe noise interference.

FIG. 1 is a perspective view of a conventional IC chip. FIG. 2 is a top view of the IC chip in FIG. 1. Referring to FIG. 1 and FIG. 2, the IC chip 100 includes a substrate 200 and a metal interconnection structure 300. The metal interconnection structure 300 is formed on a surface 202 of the substrate 200, and the metal interconnection structure 300 has a pad layout 310. The pad layout 310 is located on a surface 302 of the metal interconnection structure 300, wherein the surface 302 is one which is relative far from the substrate 200.

The pad layout 310 has a grounding pad 312 and two signal pads 314, wherein the grounding pad 312 is positioned between the two signal pads 314. In addition, the conventional technology further uses a guard ring 320 to avoid the signal pads 314 from being interfered by the others. More specifically, the signal pads 314 are surrounded by the guard rings 320, and the guard rings 320 are electrically connected to the grounding pad 312 through the traces 330 respectively. Therefore, when the a grounding wire 340 is electrically connected to the grounding pad 312 and a ground (no shown) through a wire bonding process, the guard rings 320 may be electrically connected to the ground outside the IC chip 100 through the traces 330, the grounding pad 312 and the grounding wire 340.

Generally speaking, when the working frequency of the IC chip 100 is at a low frequency level, since the parasitic effects between the guard ring 320 and the ground are weak and can be negligible, the noise between the two signal pads 314 can be smoothly discharged out of the IC chip 100 via the guard ring 320, wherein the parasitic effects, for example, is the parasitic inductance of the trace 330, the grounding pad 312 and the grounding wire 340. Therefore, when the electronic signal is at the low frequency level, the conventional design of the guard rings 320 can protect these two signal pads 314 from being interfered by the noise.

However, when the working frequency of the IC chip 100 is at a high frequency level, the above parasitic effects, like the parasitic inductance of the trace 330, the grounding pad 312 and the grounding wire 340 for example, are strong and cannot be ignored. More specifically, since the two guard rings 320 both are connected to the grounding pad 312 via the traces 330 respectively, if these two guard rings 320, these two traces 330, the grounding pad 312 and the grounding wire 340 are considered as an integrated circuit, then the total parasitic inductance of the integrated circuit will increase as the working frequency of the IC chip 100 increases.

According to the above description, when the total parasitic inductance exceeds a threshold, the noise of the adjacent two signal pads 314 cannot be smoothly discharged to the ground outside the IC chip 100 via the guard rings 320. That means when the working frequency of the IC chip 100 is at the high frequency level, these guard rings 320 used to protect the signal pads 314 can not perform well. Therefore, the high frequency electronic signals transmitted through these signal pads 314 are easily interfered by the noise. Accordingly, the conventional design of the metal interconnection structure 300 may easily worsen the performance of the IC chip 100.

SUMMARY OF THE INVENTION

The present invention provides a pad layout suitable for use on a metal interconnection structure of an IC chip. The pad layout includes a first signal pad, a second signal pad, a first non-signal pad, a second non-signal pad, a first trace, a second trace, a first guard ring and a second guard ring. The second signal pad is located adjacent to the first signal pad. The first non-signal pad is located adjacent to the first signal pad. The second non-signal pad is located adjacent to the second signal pad. The first guard ring surrounds the first signal pad, and the first guard ring is connected to the first non-signal pad through the first trace. The second guard ring surrounds the second signal pad, and the second guard ring is connected to the second non-signal pad through the second trace.

The present invention also provides an IC chip comprising a substrate and a metal interconnection structure. The substrate has a surface. The metal interconnection structure is disposed on the surface of the substrate, and the metal interconnection structure has a pad layout. The pad layout includes a first signal pad, a second signal pad, a first non-signal pad, a second non-signal pad, a first trace, a second trace, a first guard ring and a second guard ring. The second signal pad is located adjacent to the first signal pad. The first non-signal pad is located adjacent to the first signal pad. The second non-signal pad is located adjacent to the second signal pad. The first guard ring surrounds the first signal pad, and the first guard ring is connected to the first non-signal pad through the first trace. The second guard ring surrounds the second signal pad, and the second guard ring is connected to the second non-signal pad through the second trace.

DESCRIPTION OF EMBODIMENTS

Figure 3:
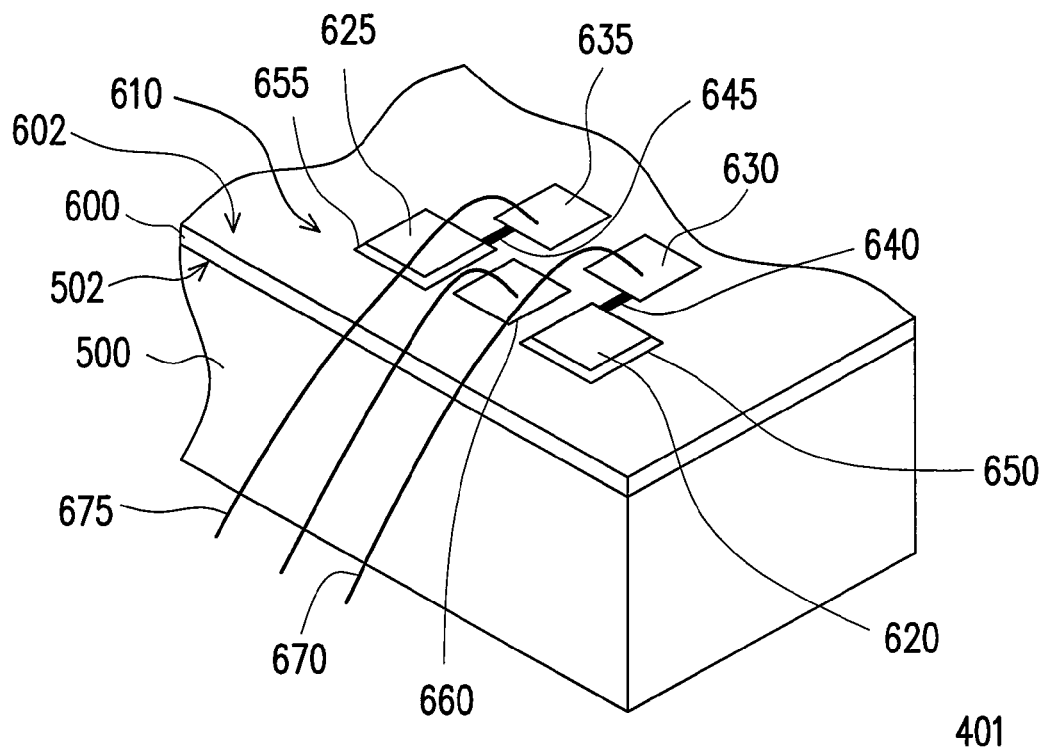
FIG. 3 is an enlarged view of an IC chip according to an embodiment of the present invention.
Figure 4:
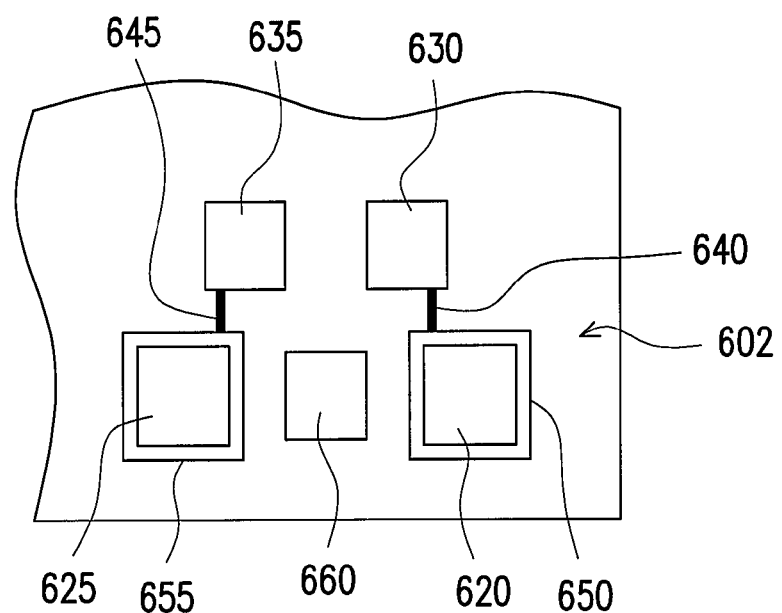
FIG. 4 is a top view of the IC chip in FIG. 3.

FIG. 3 is an enlarged view of an IC chip according to an embodiment of the present invention. FIG. 4 is a top view of the IC chip in FIG. 3. With reference to FIG. 3 and FIG. 4, the IC chip 401 includes a substrate 500 and a metal interconnection structure 600, wherein the IC chip 401 is an IC chip, for example. The substrate 500 has a surface 502. The metal interconnection structure 600 is disposed on the substrate surface 502, and the metal interconnection structure 600 has a pad layout 610. The pad layout 610 at least includes a first signal pad 620, a second signal pad 625, a first non-signal pad 630, a second non-signal pad 635, a first trace 640, a second trace 645, a first guard ring 650 and a second guard ring 655.

The first non-signal pad 630 is located adjacent to the first signal pad 620, wherein the first non-signal pad 630 is a grounding pad, for example. The second non-signal pad 635 is located adjacent to the second signal pad 625, wherein the second non-signal pad 635 is a grounding pad, for example. The first guard ring 650 is a conductive member surrounding the first signal pad 620. The first guard ring 650 is connected to the first non-signal pad 630 via the first trace 640. The second guard ring 655 is a conductive member surrounding the second signal pad 625. The second guard ring 655 is connected to the second non-signal pad 635 via the second trace 645, wherein the second guard ring 655 is electrically isolated from the first guard ring 650.

Please notice that the first non-signal pad 630 is connected to the ground outside the IC chip 401 through a first grounding wire 670, and the second non-signal pad 635 is connected to the ground outside the IC chip 401 through a second grounding wire 675. Since the first guard ring 650 and the second guard ring 655 of the present embodiment are respectively connected to the first non-signal pad 630 and the second non-signal pad 635, the electric connection path between the first guard ring 650 and the ground outside the IC chip 401 and the electric connection path between the second guard ring 655 and the ground outside the IC chip 401 are independent to each other.

Figure 1:
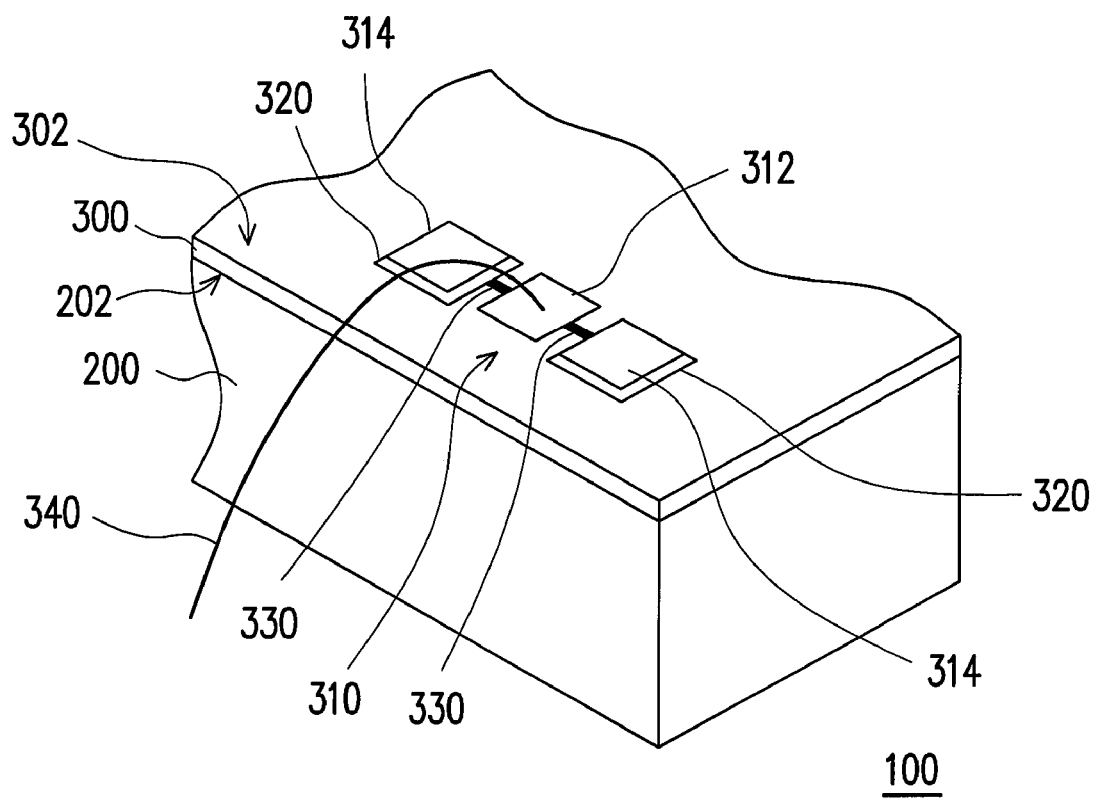
FIG. 1 is a perspective view of a conventional IC chip.
Figure 2:
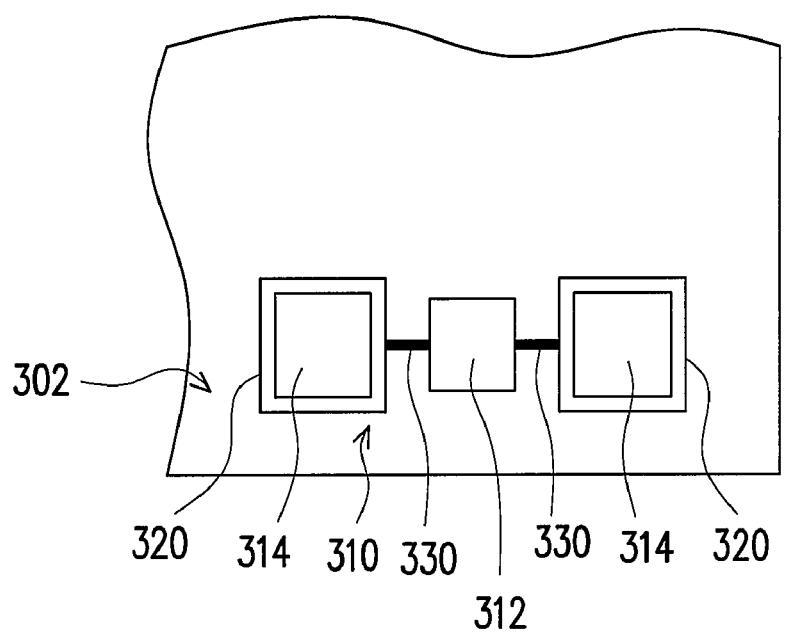
FIG. 2 is a top view of the IC chip in FIG. 1.

Referring to FIG. 1 and FIG. 3, the two guard rings 320 of the conventional technology shown in FIG. 1 are both connected to the grounding pad 312 via the wire 330. Therefore, if the two guard rings 320, the two wires 330, the grounding pad 312 and the grounding wire 340 are considered as a first integrated circuit, then the interferences between two signal pads are easily induced through the first integrated circuit. In the embodiment of the present invention shown in FIG. 3, the electric connection path between the first guard ring 650 and the ground outside the IC chip 401 and the electric connection path between the second guard ring 655 and the ground outside the IC chip 401 are independent to each other. Therefore, if the first guard ring 650, the first trace 640, the first non-signal pad 630 and the first grounding wire 670 are considered as a second integrated circuit, and the second guard ring 655, the second trace 645, the second non-signal pad 635 and the second ground wire 675 are considered as a third integrated circuit, the noise may be discharged out of the IC chip 401 more smoothly.

Figure 5:
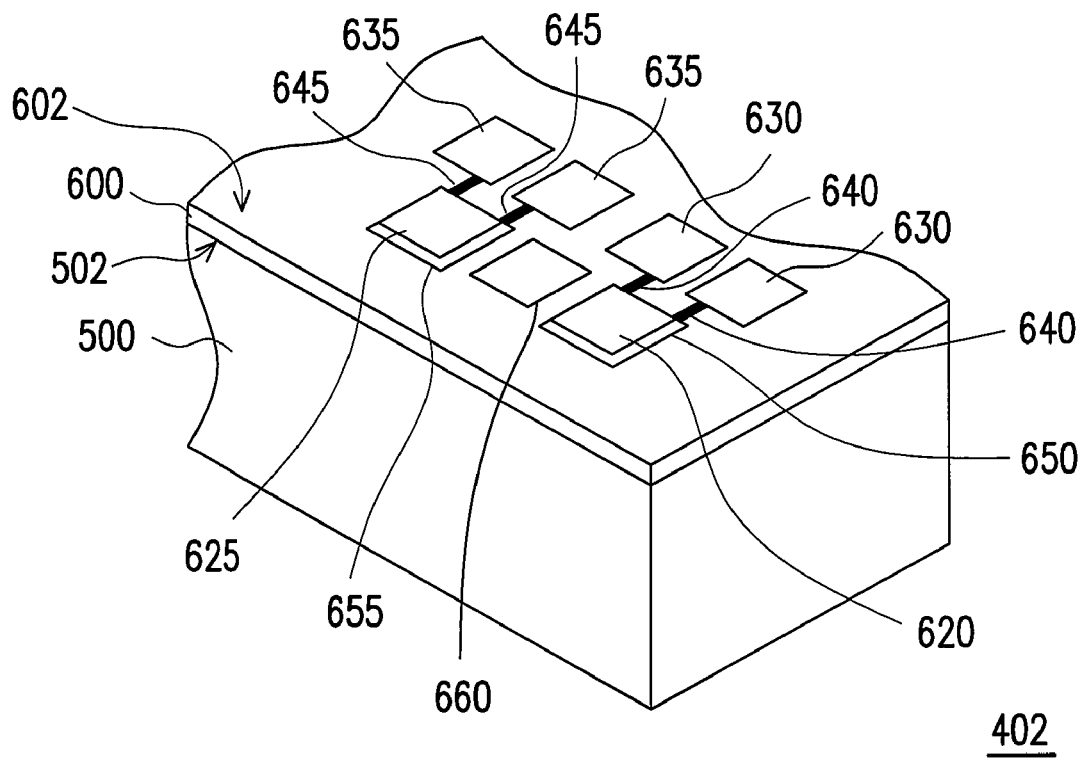
FIG. 5 is an enlarged view of an IC chip according to another embodiment of the present invention.
Figure 6:
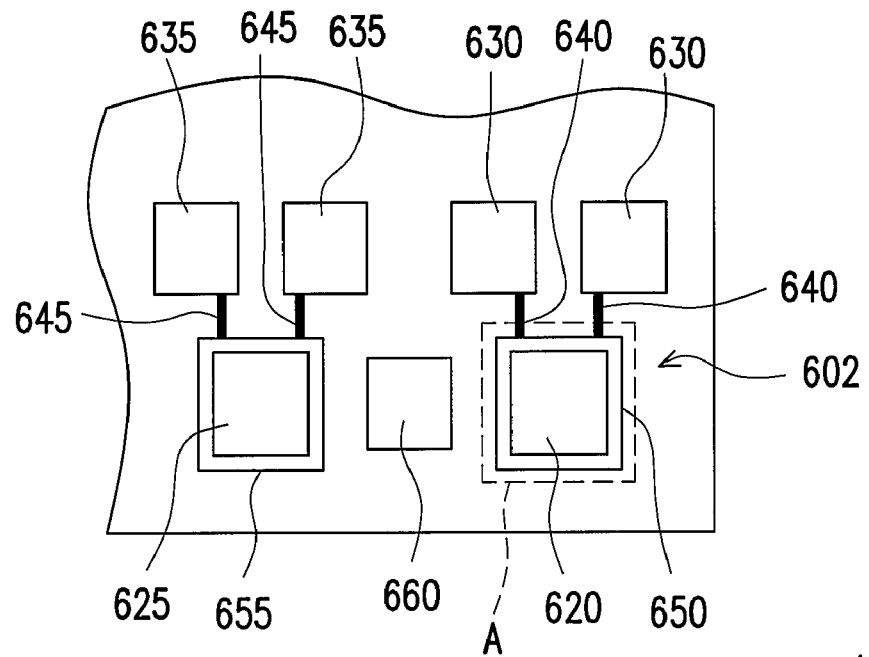
FIG. 6 is a top view of the IC chip in FIG. 5.

In order to discharge the noise out of the IC chip 401 more smoothly at the high frequency level, the first guard ring 650 may be further connected to a plurality of the first non-signal pads 630. FIG. 5 is an enlarged view of an IC chip according to another embodiment of the present invention. FIG. 6 is a top view of the IC chip in FIG. 5. This embodiment is similar to the prior embodiment except for the first guard ring 650 being electrically connected to the two first non-signal pads 630 through a plurality of the first traces 640. In this way, the noise can be smoothly discharged out of the IC chip 402 through a plurality of the first non-signal pads 630. Furthermore, the second guard ring 655 may also be connected to a plurality of the second non-signal pads 635 through a plurality of the second traces 645.

In addition, the above embodiment is not used to limit the number of the first non-signal pad 630 and the second non-signal pad 635. Furthermore, the first guard ring 650 and the second guard ring 655 may also be connected to more than two first non-signal pads 630 and more than two second non-signal pads 635 respectively through the first traces 640 and the second traces 645.

In addition, a third non-signal pad 660 may be disposed between the first signal pad 620 and the second signal pad 625. Through the third non-signal pad 660, the inductive and capacitive coupling between the first signal pad 620 and the second signal pad 625 may be reduced so that the electronic signals in the first signal pad 620 is less likely interfered by the second signal pad 625.

Figure 7:
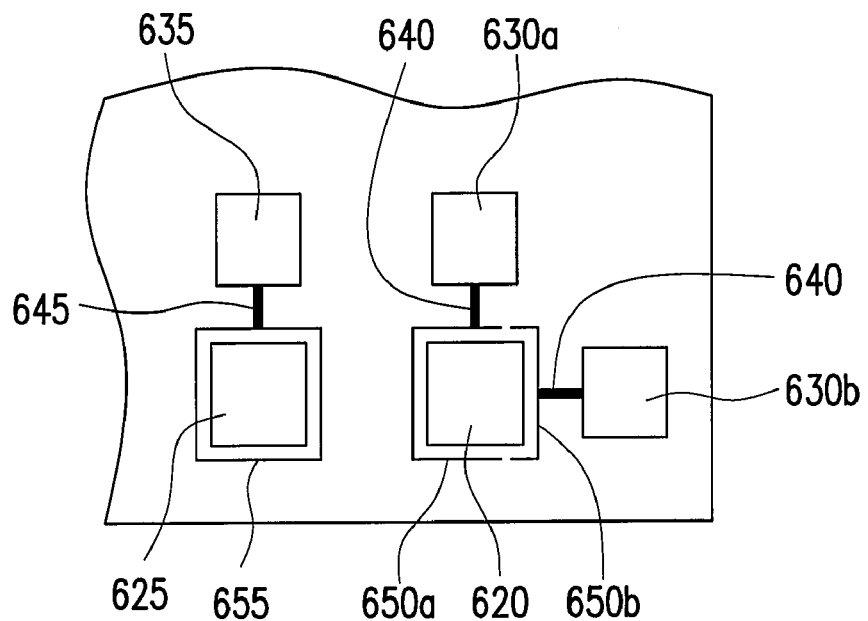
FIG. 7 is an enlarged view of the A region in FIG. 6.

It should be noted that the above embodiments are not used to limit guard rings (650 and 655) to a continuous conductive member. In other embodiments of the present invention, the guarding rings may further be a non-continuous conductive member. FIG. 7 is a top view of an IC chip according to another embodiment of the present invention. The first guard ring 650 of the IC chip 403 may include two line sections 650a and 650b that are isolated from each other. Thus the line section 650a and the line section 650b may be connected to different first non-signal pads 630a and 630b respectively through a plurality of the first traces 640 so that the noise interference can be discharged out of the IC chip 403 more smoothly. However, it should be noted that the number of the line sections included in the guard ring is not limited to two, and the first guard ring 650 may also comprise more than two line sections.

In another embodiment of the present invention, a low conductive region may further be formed on a portion of the substrate so that the portion of the substrate 500 around the first signal pad 620 and the second signal pad 625 may become the interfering path of the interference signal.

Figure 8:
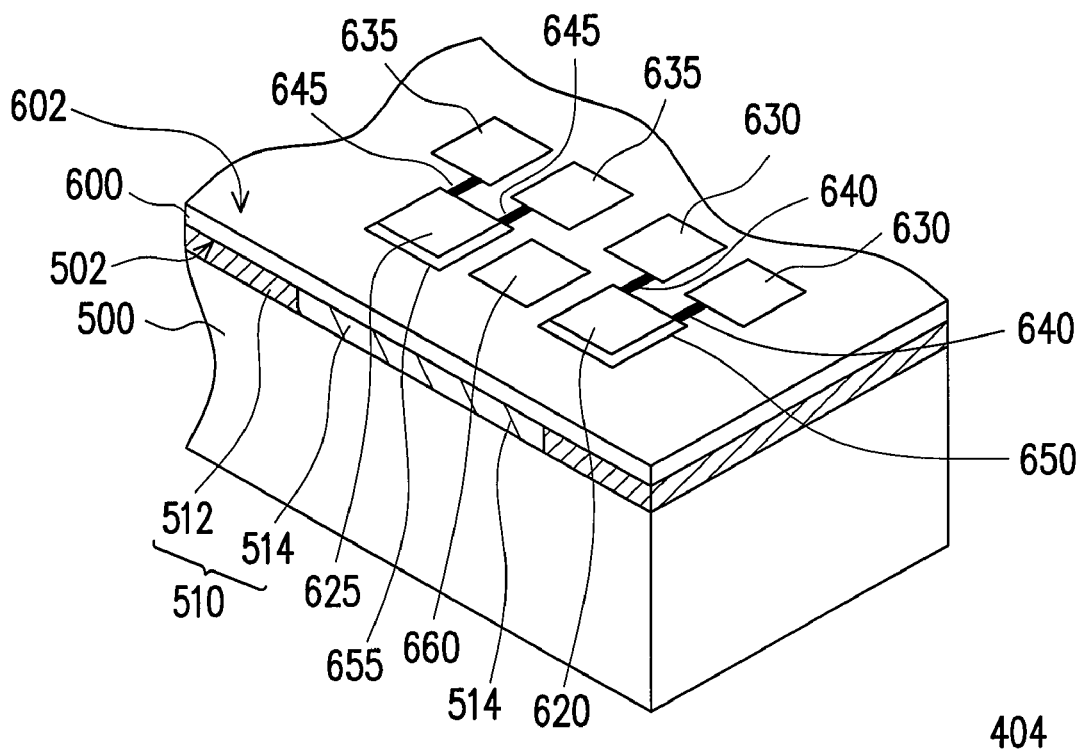
FIG. 8 is an enlarged view of an IC chip according to yet another embodiment of the present invention.
Figure 9:
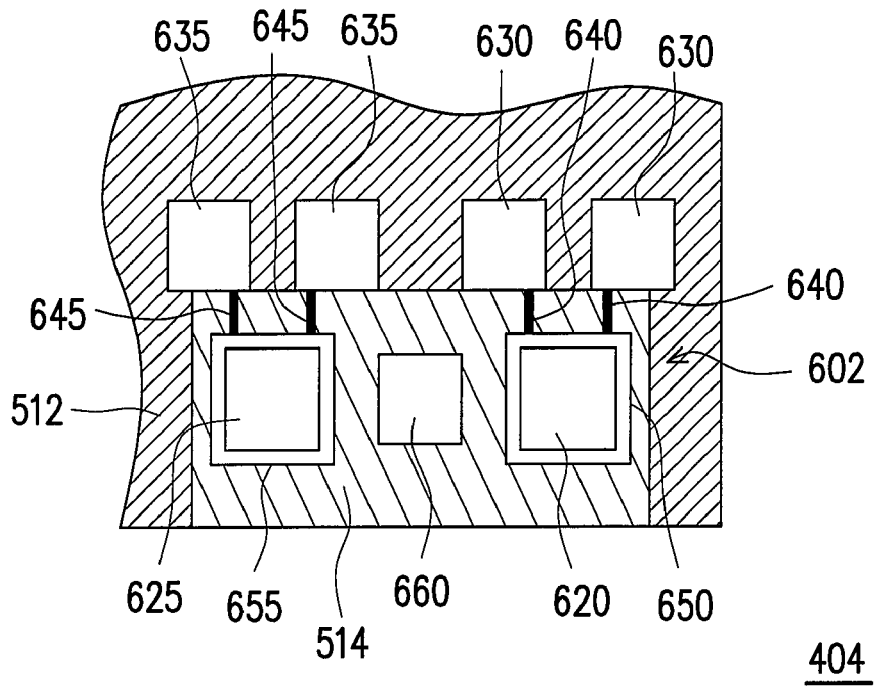
FIG. 9 is a top view of the IC chip in FIG. 8.

FIG. 8 is an enlarged view of an IC chip according to yet another embodiment of the present invention. FIG. 9 is a top view of the IC chip in FIG. 8. The substrate 500 of the IC chip 404 has a surface layer 510 which includes a surface 502. The surface layer 510 has a first doped region 512 and a second doped region 514, wherein the conductivity of the first doped region 512 is greater than the conductivity of the second doped region 514. For example, when the first doped region 512 is a highly doped P doped region, the second doped region 514 may be a lightly doped P doped region, an N doped region or an un-doped region, wherein the N doped region for example is a Nepi region. Of course, the first doped region 512 may also be a highly doped N doped region and the second doped region 514 may be a lightly doped N doped region, a P doped region or an un-doped region.

Figure 10:
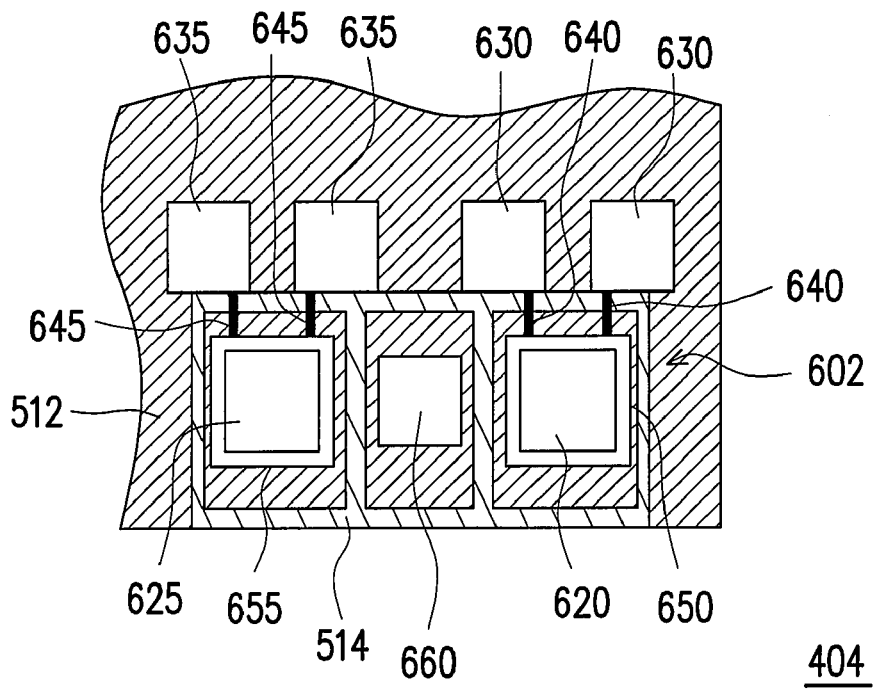
FIG. 10 is a top view of another type of the second doped region in FIG. 9.

The first doped region 512 is located in the region outside the second doped region 514 of the surface layer 510, and the projections of the first signal pad 620, the second signal pad 625, the first guard ring 650 and the second guard ring 655 on the surface layer 510 are located in the second doped region 514. Remarkably, although the projections of the first signal pad 620 and the second signal pad 625 on the surface layer 510 are overlapped the projection of the second doped region 514 on the surface layer 510, the structure and the arrangement of the second doped region 514 are not intended to limit the scope of the present invention. The second doped region 514 may be disposed, for example as shown in FIG. 10, surrounding the projections of the first signal pad 620 and the second signal pad 625 on the surface layer 510.

According to the above description, compared to the conventional IC chip surface layer which is comprised of a first doped region, as the conductivity of the second doped region 514 is lower than that of the first doped region 512, therefore, the interference signal is not likely spread to the adjacent area.

In the present embodiment, the second doped region may be fabricated using the semiconductor process where the doping concentration may be properly controlled. For example, the conductivity of the second doped region can be controlled to be less than 250 S/m.

In summary, according to the pad layout of the present invention, the guard rings are connected to different signal pads respectively so that a non-signal pad is connected to only a single guard ring, therefore at the high frequency level, the noise may be discharged out of the IC chip more smoothly through the guard rings and the non-signal pads. Therefore, the possibility of the electronic signals transmitted through the signal pads of the pad layout of the present invention from being interfered by the noise may be minimized.

In addition, a plurality of the non-signal pads may be connected to the same guard ring, and a non-signal pad may be connected to a single guard ring so that the noise can be discharged out of the IC chip more smoothly. Moreover, the guard ring of the present invention may comprise a plurality of the line sections which are independent to each other, and each line section is connected to more than one non-signal pads so that the noise is discharged more smoothly.

In addition, a first doped region and a second doped region may be formed of the surface layer of the substrate, and both of the projections of the signal pad and the guard ring on the surface layer may be formed in the second doped region, and therefore the noise is less likely spread to the first doped region through the second doped region.

Since the IC chip of the present invention has the above advantages, therefore at the high frequency level, the IC chip of the present invention can have a better performance compared to the conventional IC chip.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pad layout, suitable for use in a metal interconnection structure of an IC chip, the pad layout comprising:
   a first signal pad;
   a second signal pad, located adjacent to the first signal pad;
   a first non-signal pad, located adjacent to the first signal pad;
   a second non-signal pad, located adjacent to the second signal pad;
   a first guard ring, surrounding the first signal pad, the first guard ring being connected to the first non-signal pad through a first trace; and
   a second guard ring, surrounding the second signal pad, the second guard ring being connected to the second non-signal pad through a second trace.

2. The pad layout as claimed in claim 1, wherein the first non-signal pad and the second non-signal pad are grounding pads.

3. The pad layout as claimed in claim 1, further comprising a third non-signal pad disposed between the first signal pad and the second signal pad.

4. The pad layout as claimed in claim 3, wherein the third non-signal pad is a grounding pad.

5. The pad layout as claimed in claim 1, further comprising a plurality of the first non-signal pads and a plurality of the first traces, the first guard ring being connected to the first non-signal pads respectively through the first traces.

6. The pad layout as claimed in claim 1, wherein the first guard ring comprises a plurality of first line sections which are isolated from each other, and the first line sections are connected to the first non-signal pads respectively through the first traces.

7. The pad layout as claimed in claim 1, further comprising a plurality of the second non-signal pads and a plurality of the second traces, the second guard ring being connected to the second non-signal pads respectively through the second traces.

8. The pad layout as claimed in claim 7, wherein the second guard ring comprises a plurality of second line sections which are isolated from each other, and the second line sections are connected to the second non-signal pads respectively through the second traces.

9. An IC chip, comprising:
   a substrate, having a surface; and
   a metal interconnection structure disposed on the surface of the substrate, and having a pad layout comprising:
      a first signal pad;
      a second signal pad, located adjacent to the first signal pad;
      a first non-signal pad, located adjacent to the first signal pad;
      a second non-signal pad, located adjacent to the second signal pad;
      a first guard ring, surrounding the first signal pad, the first guard ring being connected to the first non-signal pad through a first trace; and
      a second guard ring, surrounding the second signal pad, the second guard ring being connected to the second non-signal pad through a second trace.

10. The IC chip as claimed in claim 9, wherein the first non-signal pad and the second non-signal pad are grounding pads.

11. The IC chip as claimed in claim 9, further comprising a third non-signal pad disposed between the first signal pad and the second signal pad.

12. The IC chip as claimed in claim 11 wherein the third non-signal pad is a grounding pad.

13. The IC chip as claimed in claim 9, further comprising a plurality of the first non-signal pads and a plurality of the first traces, the first guard ring being connected to the first non-signal pads respectively through the first traces.

14. The IC chip as claimed in claim 9, wherein the first guard ring comprises a plurality of the first line sections which are isolated from each other, and the first line sections are connected to the first non-signal pads through these first traces.

15. The IC chip as claimed in claim 9, further comprising a plurality of the second non-signal pads and a plurality of the second traces, the second guard ring being connected to the second non-signal pads respectively through the second traces.

16. The IC chip as claimed in claim 15, wherein the second guard ring comprises a plurality of the second line sections which are isolated from each other, and the second line sections are connected to the second non-signal pads respectively through the second traces.

17. The IC chip as claimed in claim 9, wherein the substrate has a surface layer comprising the substrate surface, the surface layer has a first doped region and a second doped region, and the conductivity of the first doped region is greater than the conductivity of the second doped region, projections of the first signal pad and the first guard ring on the surface layer and projections of the second signal pad and the second guard ring on the surface layer are surrounded by the second doped region.

18. The IC chip as claimed in claim 9, wherein the substrate has a surface layer comprising the substrate surface, the surface layer has a first doped region and a second doped region, and the conductivity of the first doped region is greater than the conductivity of the second doped region, projections of the first signal pad and the first guard ring on the surface layer and projections of the second signal pad and the second guard ring on the surface layer are located in the second doped region.

19. The IC chip as claimed in claim 17, wherein the first doped region is a first P doped region, the second doped region is a second P doped region, an N doped region or an un-doped region.

20. The IC chip as claimed in claim 17, wherein the first doped region is a first N doped region, the second doped region is a second N doped region, a P doped region or an un-doped region.

* * * * *